(12) United States Patent
Valeriy et al.

(10) Patent No.: US 12,177,994 B2
(45) Date of Patent: Dec. 24, 2024

(54) ELECTRONIC DEVICE

(71) Applicant: Samsung Electronics Co., Ltd., Suwon-si (KR)

(72) Inventors: Prushinskiy Valeriy, Suwon-si (KR); Minwoo Yoo, Suwon-si (KR); Hyungsok Yeo, Suwon-si (KR); Changryong Heo, Suwon-si (KR); Seonho Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 211 days.

(21) Appl. No.: 17/830,421

(22) Filed: Jun. 2, 2022

(65) Prior Publication Data

US 2022/0295651 A1    Sep. 15, 2022

Related U.S. Application Data

(63) Continuation of application No. PCT/KR2021/018084, filed on Dec. 2, 2021.

(30) Foreign Application Priority Data

Dec. 2, 2020 (KR) .......... 10-2020-0166469
Jan. 29, 2021 (KR) .......... 10-2021-0013071

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .. H05K 5/0217; H05K 5/0017; G06F 1/1624; G06F 1/1652; G06F 1/1656; G06F 1/1677; G06F 1/1681; H04M 1/0268; H04M 1/0235; G09F 9/30
See application file for complete search history.

(56) References Cited

U.S. PATENT DOCUMENTS

| | | | |
|---|---|---|---|
| 9,823,697 B2* | 11/2017 | Hsu ...................... | G06F 1/1624 |
| 10,045,448 B2 | 8/2018 | Yang | |
| 10,185,365 B2 | 1/2019 | Yang | |
| 10,194,543 B2 | 1/2019 | Seo et al. | |
| 10,390,443 B2 | 8/2019 | Kim et al. | |
| 10,448,521 B2* | 10/2019 | Seo ...................... | H05K 1/0203 |
| 10,582,622 B2 | 3/2020 | Kim et al. | |

(Continued)

FOREIGN PATENT DOCUMENTS

| | | |
|---|---|---|
| JP | 2017536760 A | 12/2017 |
| KR | 10-2018-0040181 A | 4/2018 |

(Continued)

*Primary Examiner* — Sagar Shrestha

(57) ABSTRACT

An electronic device according to various embodiments includes a display, a first housing including an upper cover, a lower cover, a first side cover configured to connect the upper cover and the lower cover, and a pair of second side covers configured to connect the upper cover, the lower cover, and the first side cover, a first roller disposed adjacent to the first side cover and configured to wind the display, a second housing connected to the display, and a moving structure disposed opposite to the first side cover and configured to move the second housing from the first housing.

6 Claims, 15 Drawing Sheets

(56) References Cited

U.S. PATENT DOCUMENTS

| | | | |
|---|---|---|---|
| 10,750,625 B2 | 8/2020 | Park | |
| 10,782,740 B2 | 9/2020 | Kim et al. | |
| 10,878,728 B2 | 12/2020 | Yoon | |
| 10,881,009 B2* | 12/2020 | Jiang | H05K 5/0017 |
| 11,141,947 B2 | 10/2021 | Lootvoet et al. | |
| 11,644,867 B2* | 5/2023 | Ahn | G06F 1/1647 |
| | | | 361/679.27 |
| 11,809,231 B2* | 11/2023 | Feng | G06F 1/1652 |
| 2007/0146243 A1* | 6/2007 | Ou Yang | G06F 1/1601 |
| | | | 345/76 |
| 2013/0058063 A1* | 3/2013 | O'Brien | G06F 1/1624 |
| | | | 361/807 |
| 2016/0100478 A1* | 4/2016 | Lee | G06F 1/1624 |
| | | | 361/749 |
| 2017/0311461 A1 | 10/2017 | Yang | |
| 2018/0014417 A1* | 1/2018 | Seo | H05K 7/20954 |
| 2018/0102072 A1* | 4/2018 | Lee | G09G 3/20 |
| 2018/0103552 A1* | 4/2018 | Seo | H05K 5/0017 |
| 2019/0315109 A1 | 10/2019 | Zhang et al. | |
| 2019/0317550 A1 | 10/2019 | Kim et al. | |
| 2019/0324501 A1 | 10/2019 | Kim et al. | |
| 2020/0107458 A1 | 4/2020 | Park | |
| 2020/0152095 A1* | 5/2020 | Lee | G09F 9/301 |
| 2020/0267246 A1* | 8/2020 | Song | H05K 1/148 |
| 2020/0363841 A1* | 11/2020 | Kim | G06F 1/1626 |
| 2021/0135492 A1* | 5/2021 | Kim | H02J 7/02 |
| 2023/0122323 A1* | 4/2023 | Kwak | G06F 3/0448 |
| | | | 361/679.27 |

FOREIGN PATENT DOCUMENTS

| | | |
|---|---|---|
| KR | 10-2018-0107065 A | 10/2018 |
| KR | 10-2018-0135704 A | 12/2018 |
| KR | 10-2019-0077107 A | 7/2019 |
| KR | 10-2020-0007366 A | 1/2020 |

* cited by examiner

ELECTRONIC DEVICE

CROSS-REFERENCE TO RELATED APPLICATIONS

This application is a continuation of International Application No. PCT/KR2021/018084 filed on Dec. 2, 2021, in the Korean Intellectual Property Receiving Office, which claims priority to Korean Patent Application No. 10-2020-0166469 filed on Dec. 2, 2020, and Korean Patent Application No. 10-2021-0013071 filed on Jan. 29, 2021, in the Korean Intellectual Property Office, the disclosures of which are incorporated herein by reference in their entirety.

BACKGROUND

1. Field

The disclosure relates to an electronic device.

2. Description of Related Art

An electronic device that rolls out a flexible display is under development. The electronic device may be classified into a rolling-type electronic device that rolls out the display on a rolling axis and a sliding-type electronic device that rolls out the display onto a rear side of the electronic device.

SUMMARY

Embodiments of the disclosure may provide an electronic device having a space for mounting therein electrical and electronic components.

According to an example embodiment, an electronic device includes a display, a first housing including an upper cover, a lower cover, a first side cover configured to connect the upper cover and the lower cover, and a pair of second side covers configured to connect the upper cover, the lower cover, and the first side cover, a first roller disposed adjacent to the first side cover and configured to wind the display, a second housing connected to the display, and a moving structure disposed opposite to the first side cover and configured to move the second housing from the first housing.

According to various embodiments described herein, securing a sufficient space for mounting electrical and electronic components may enable the improvement of the performance of the electrical and electronic components installed in such a mounting space.

Other features and aspects will be apparent from the following detailed description, the drawings, and the claims.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
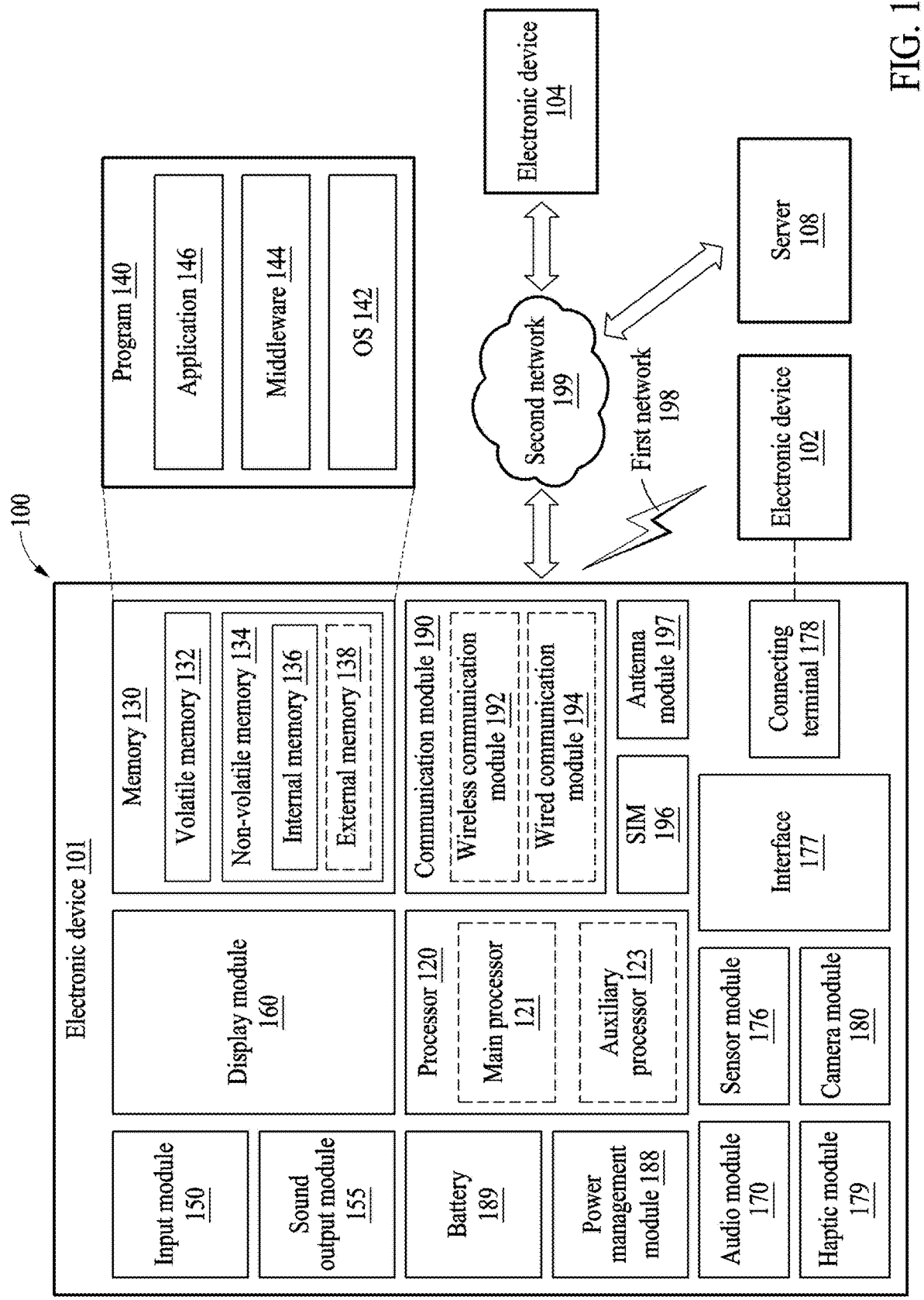
FIG. 1 is a block diagram illustrating an example electronic device in a network environment according to various example embodiments.

FIG. 1 is a block diagram illustrating an example electronic device in a network environment according to various embodiments.

Referring to FIG. 1, an electronic device 101 in a network environment 100 may communicate with an electronic device 102 via a first network 198 (e.g., a short-range wireless communication network), or communicate with at least one of an electronic device 104 and a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may alternatively or additionally include a software structure other than the hardware structure.

The memory 130 may store various data used by at least one component (e.g., the processor 120 or the sensor module 176) of the electronic device 101. The data may include, for example, software (e.g., the program 140) and input data or output data for a command related thereto. The memory 130 may include the volatile memory 132 or the non-volatile memory 134. The non-volatile memory 134 may include an internal memory 136 and an external memory 138. The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing records. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a display, a hologram device, or a projector, and a control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output module 155 or an external electronic device (e.g., the electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with an external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator. The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC). The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and an external electronic device (e.g., the electronic device 102, the electronic device 104, or the server 108) and performing communication via the established communication channel. The communication module 190 may include one or more communication processors that are operable independently of the processor 120 (e.g., an AP) and that support direct (e.g., wired) communication or wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multiple components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated high-frequency band (e.g., the mmWave band), and a plurality of antennas (e.g., array antennas) disposed on a second surface (e.g., a top or a side surface) of the PCB or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general-purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least a part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least a part of a reply to the request. To that end, a cloud computing, distributed computing, mobile edge computing (MEC), or client-server computing technology may be used, for example. The electronic device 101 may provide ultra-low latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

An electronic device according to various example embodiments of the present disclosure may be a device of various types. The electronic device may include, for example, a portable communication device (e.g., a smartphone, etc.), a computing device, a portable multimedia device, a portable medical device, a camera, a wearable device, or a home appliance. However, the electronic device is not limited to the foregoing examples.

It should be construed that various example embodiments of the present disclosure and the terms used therein are not intended to limit the technological features set forth herein to some particular embodiments but include various changes, equivalents, or replacements of the example embodiments. In connection with the description of the drawings, like reference numerals may be used for similar or related components. It should be understood that a singular form of a noun corresponding to an item may include one or more of the things, unless the relevant context clearly indicates otherwise. As used herein, "A or B," "at least one of A and B," "at least one of A or B," "A, B, or C," "at least one of A, B, and C," and "A, B, or C," each of which may include any one of the items listed together in the corresponding one of the phrases, or all possible combinations thereof. Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure. It should also be understood that, when a component (e.g., a first component) is referred to as being "connected to" or "coupled to" another component with or without the term "functionally" or "communicatively," the component can be connected or coupled to the other component directly (e.g., wiredly), wirelessly, or via a third component.

As used in connection with various example embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an example embodiment, the module may be implemented in the form of an application-specific integrated circuit (ASIC).

Various example embodiments set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to various example embodiments, a method according to an example embodiment of the disclosure may be included and provided in a computer program product.

The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components or operations may be omitted, or one or more other components or operations may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
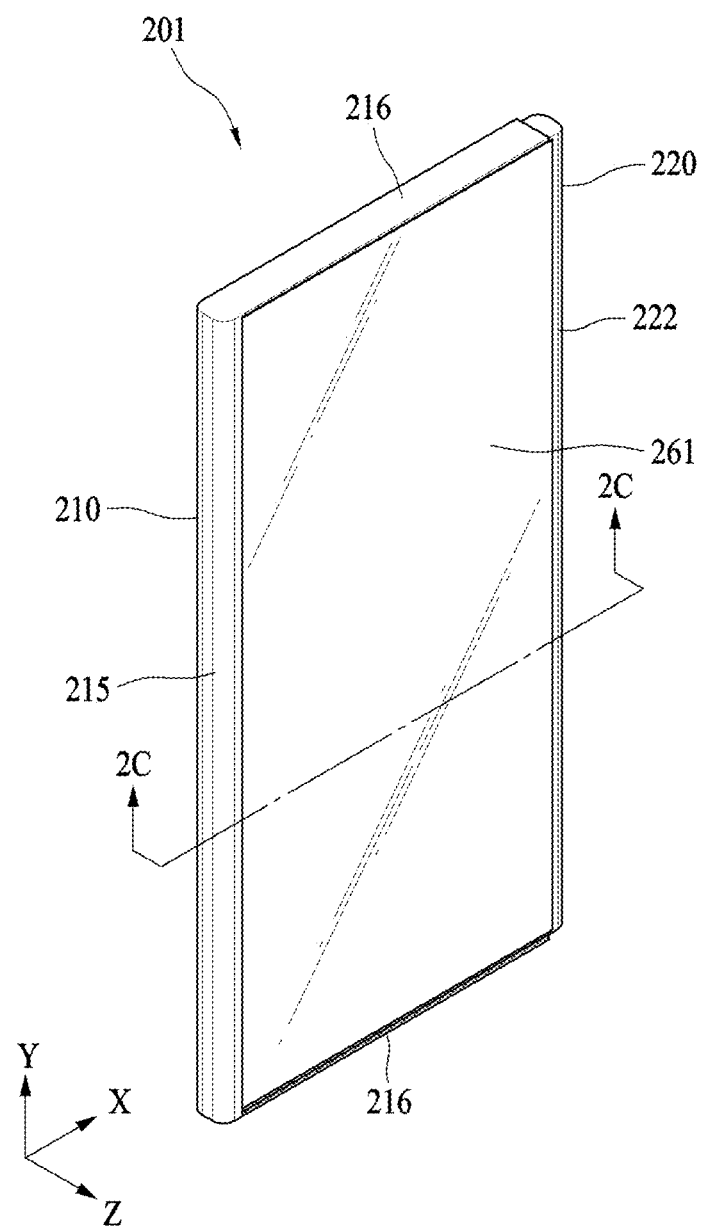
FIG. 2A is a perspective view of an example electronic device with a display reduced according to an example embodiment.
Figure 2B:
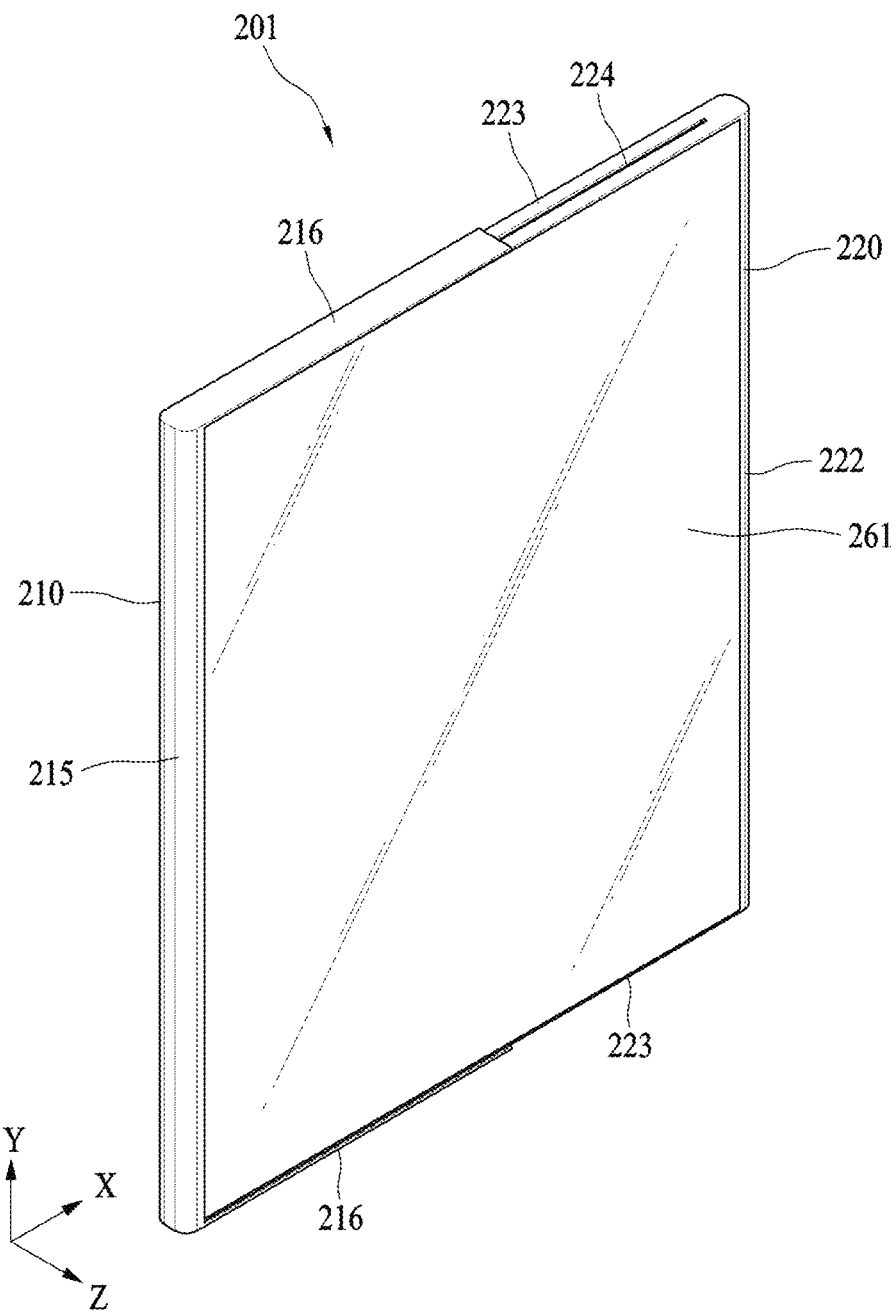
FIG. 2B is a perspective view of an example electronic device with a display extended according to an example embodiment.
Figure 2C:
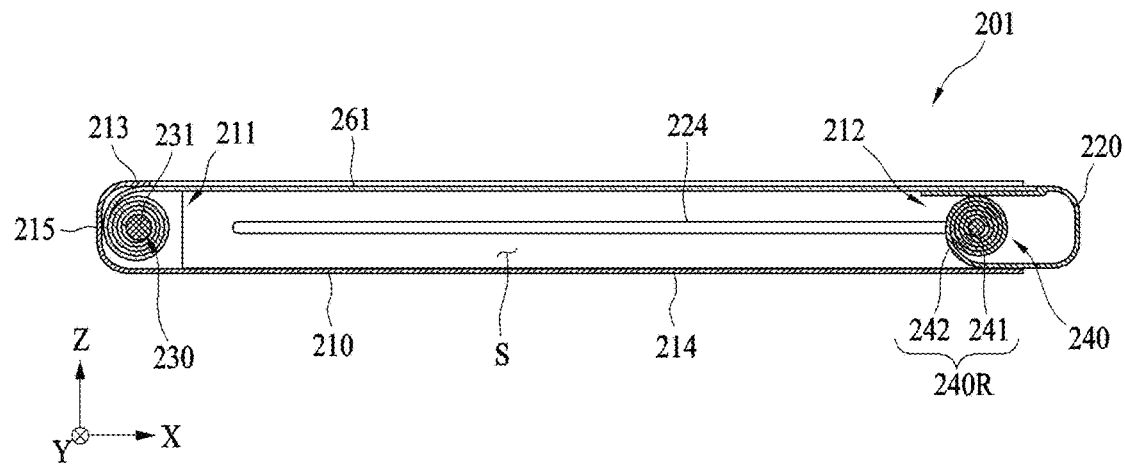
FIG. 2C is a cross-sectional view of the electronic device of FIG. 2A cut by a 2C-2C line.
Figure 2D:
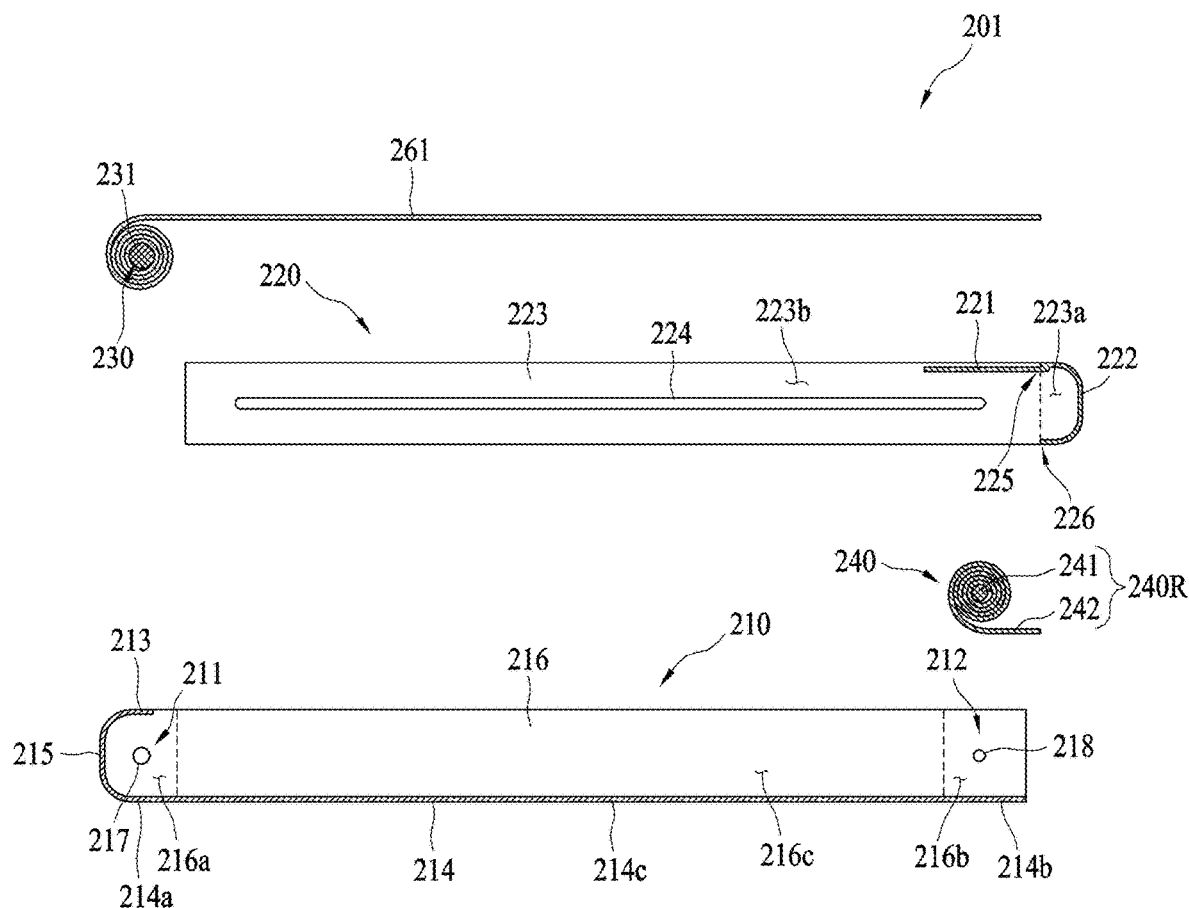
FIG. 2D is an exploded cross-sectional view of an example electronic device according to an example embodiment.

FIG. 2A is a perspective view of an example electronic device with a display reduced according to an example embodiment, and FIG. 2B is a perspective view of an example electronic device with a display extended according to an example embodiment. FIG. 2C is a cross-sectional view of the electronic device of FIG. 2A cut by a 2C-2C line, and FIG. 2D is an exploded cross-sectional view of an example electronic device according to an example embodiment.

Referring to FIGS. 2A through 2D, according to an example embodiment, an electronic device 201 may operate in a form in which a display 261 is reduced as a first side cover 215 of a first housing 210 and a slider 222 of a second housing 220 are closer to each other and operate in a form in which the display 261 is extended as the first side cover 215 of the first housing 210 and the slider 222 of the second housing 220 are remote from each other, while securing a mounting space S surrounded by the first housing 210, the second housing 220, and the display 261. In the embodiment, the mounting space S may be a space that is surrounded by a lower cover 214, the first side cover 215, and a pair of second side covers 216 of the first housing 210, the display 261, and a support 221 and the slider 222 of the second housing 220, and is formed between a first roller 230 and a moving structure 240 without a separate mechanical component(s). In the mounting space S, at least one component among a camera module (e.g., the camera module 180 of FIG. 1), a communication module (e.g., the communication module 190 of FIG. 1), and an antenna module (e.g., the antenna module 197 of FIG. 1) may be installed. Securing the mounting space S may prevent an interference between the second housing 220 and at least one component among the camera module, the communication module, and the antenna module installed in the mounting space S when the second housing 220 moves or while the second housing 220 is moving. The electronic device 201 may include the first housing 210, the second housing 220, the first roller 230, the moving structure 240, and the display 261.

The first housing 210 may include an upper cover 213, the lower cover 214, the first side cover 215, and the pair of second side covers 216.

The first housing 210 may have a first side 211 and a second side 212. The first side 211 of the first housing 210 may be a portion surrounded by the upper cover 213, a first end region 214a of the lower cover 214, the first side cover 215, and a first end region 216a of the pair of second side covers 216. The second side 212 of the first housing 210 may be a portion surrounded by a second end region 214b of the lower cover 214 and a second end region 216b of the pair of second side covers 216. In this case, the mounting space S may be a space surrounded by the display 261, an extending region 214c that extends between the first end region 214a and the second end region 214b of the lower cover 214, and an extending region 216c that extends between the first end region 216a and the second end region 216b of the pair of second side covers 216.

The upper cover 213 and the lower cover 214 may extend substantially in parallel in a single direction (e.g., an X direction in FIG. 2C). In the embodiment, an extending length of the upper cover 213 may be less than an extending length of the lower cover 214. The size of an area of the display 261 that is viewed from the outside of the electronic device 201 may be determined by a distance by which the slider 222 of the second housing 220 is separated from the first side cover 215 of the first housing 210.

The first side cover 215 may connect the upper cover 213 and the first end region 214a of the lower cover 214 while covering a first surface (e.g., a YZ plane in FIG. 2B) of the first housing 210. The second side covers 216 may connect the upper cover 213, all the regions 214a, 214b, and 214c of the lower cover 214, and the first side cover 215 while covering a second surface (e.g., an XZ plane in FIG. 2B) of the first housing 210. In the embodiment, the pair of second side covers 216 may be the same in shape and structure.

The second side cover 216 may include a first axial groove 217 disposed on the first side 211 of the first housing 210 and a second axial groove 218 disposed on the second side 212 of the first housing 210. The first roller 230 may be installed in the first axial groove 217 and the moving structure 240 may be installed in the second axial groove 218.

The second housing 220 may include the support 221, the slider 222, and a pair of third side covers 223.

The support 221 may support the display 261. In the embodiment, the support 221 may support a surface of the display 261 while the display 261 is extending in a first direction (e.g., an X direction in FIG. 2C) or being reduced in a second direction (e.g., a −X direction in FIG. 2C) different from the first direction. The support 221 may extend in the second direction (e.g., the −X direction in FIG. 2C) along the surface of the display 261.

The slider 222 may recede from the first housing 210 while sliding in the first direction (e.g., the X direction in FIG. 2C), or approach the first housing 210 while sliding in the second direction (e.g., the −X direction in FIG. 2C) different from the first direction. When the slider 222 slides in the first direction, the support 221 may move in the first direction and the display 261 supported by the support 221 may be extended in the first direction. When the slider 222 slides in the second direction, the support 221 may move in the second direction and the display 261 supported by the support 221 may be reduced in the second direction.

The slider 222 may have a proximal portion 225 adjacent to the display 261 and a distal portion 226 remote from the display 261. The support 221 may be installed in the proximal portion 225 of the slider 222. The support 221 may form a stepped portion with the slider 222, and extend from the proximal portion 225 of the slider 222 in the second direction (e.g., the −X direction in FIG. 2C). The display 261 may be disposed on the support 221 until an end of the display 261 is disposed in the stepped portion between the support 221 and the slider 222 or disposed adjacent to the stepped portion.

The pair of third side covers 223 may cover a side surface (e.g., an XZ plane in FIG. 2B) of the second housing 220. The third side covers 223 may connect the support 221 and the slider 222 and extend in the second direction (e.g., the −X direction in FIG. 2C) toward the first side 211 of the first housing 210. The third side covers 223 may move in the first direction (e.g., the X direction in FIG. 2C) or in the second direction (e.g., the −X direction in FIG. 2C) along the second side covers 216 of the first housing 210, while the slider 222 is sliding. In the embodiment, the third side covers 223 of the second housing 220 may be disposed further inward than the second side covers 216 of the first housing 210. In the embodiment, the pair of third side covers 223 may include a slot 224. The slot 224 may be formed in a direction in which the third side covers 223 extend. In the embodiment, the pair of third side covers 223 may include an end region 223a and an extending region 223b extending from the end region 223a in a direction (e.g., the −X direction in FIG. 2C).

The first roller 230 may wind the display 261. The first roller 230 may be disposed in the first axial groove 217 formed in the first end region 216a of the pair of second side covers 216, while being adjacent to the first side cover 215. The first roller 230 may include a first shaft 231 rotatably installed in the first axial groove 217.

The moving structure 240 may move the second housing 220 from the first housing 210 in the first direction (e.g., the X direction in FIG. 2C) to extend the display 261 in the first direction, and move the second housing 220 in the second direction (e.g., the −X direction in FIG. 2C) toward the first housing 210 to reduce the display 261 in the second direction. The moving structure 240 may be disposed in the second axial groove 218 formed in the second end region 216b of the pair of second side covers 216 of the first housing 210. The first roller 230 and the moving structure 240 may be disposed separately from each other with the mounting space S therebetween, and thus an interference in the component(s) that may be installed in the mounting space S may be prevented.

In the embodiment, the moving structure 240 may include a second roller 240R. The second roller 240R may include a second shaft 241 and a plate 242 configured to be wound around the second shaft 241. The second shaft 241 may be installed in the second axial groove 218 and guided along the slot 224. A movement range of the second shaft 241 may be determined based on a length of the slot 224. The plate 242 may push the distal portion 226 of the slider 222 when unwound from the second shaft 241, and pull the distal portion 226 of the slider 222 when wound onto the second shaft 241. An end of the plate 242 may be connected to the second shaft 241, and the other end of the plate 242 may be connected to the distal portion 226 of the slider 222. In an example embodiment, the plate 242 may be formed of a rigid material and be flexibly wound around the second shaft 241. In another example embodiment, the plate 242 may be formed of a flexible material. In the embodiment, the second shaft 241 of the second roller 240R may rotate while being constrained to the first housing 210. Accordingly, in order for the second housing 220 to move with respect to the first housing 210, the slot 224 may be formed in the pair of third side covers 223 of the second housing 220.

Figure 2E:
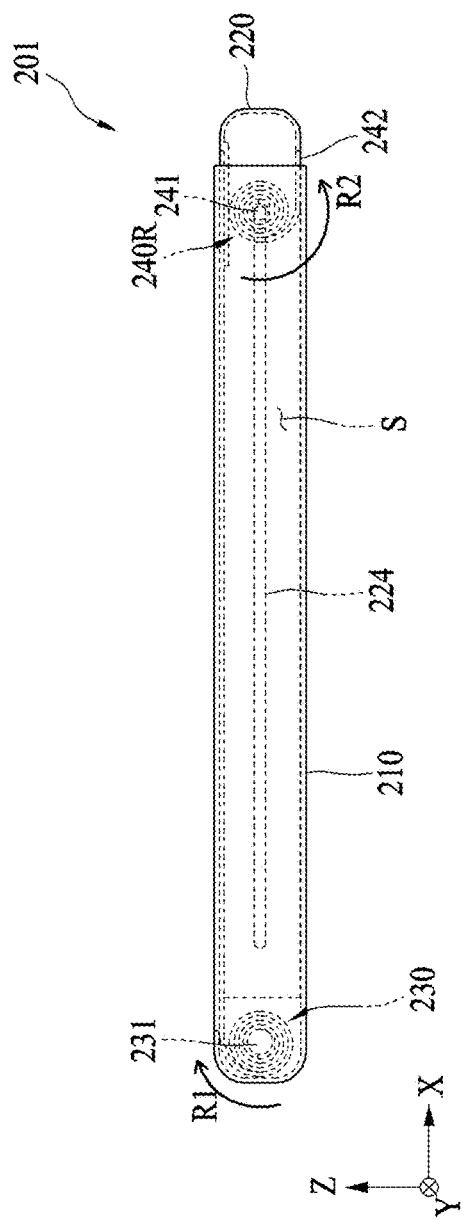
FIGS. 2E through 2G are diagrams illustrating an example operation of an electronic device according to an example embodiment.
Figure 2F:
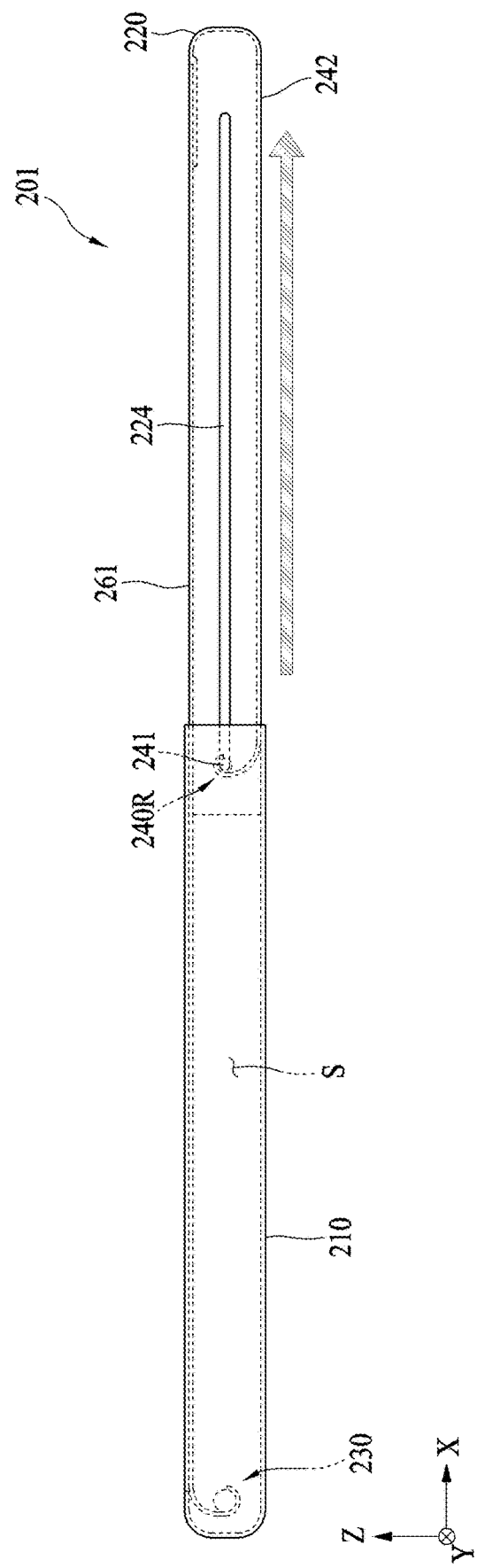
Figure 2G:
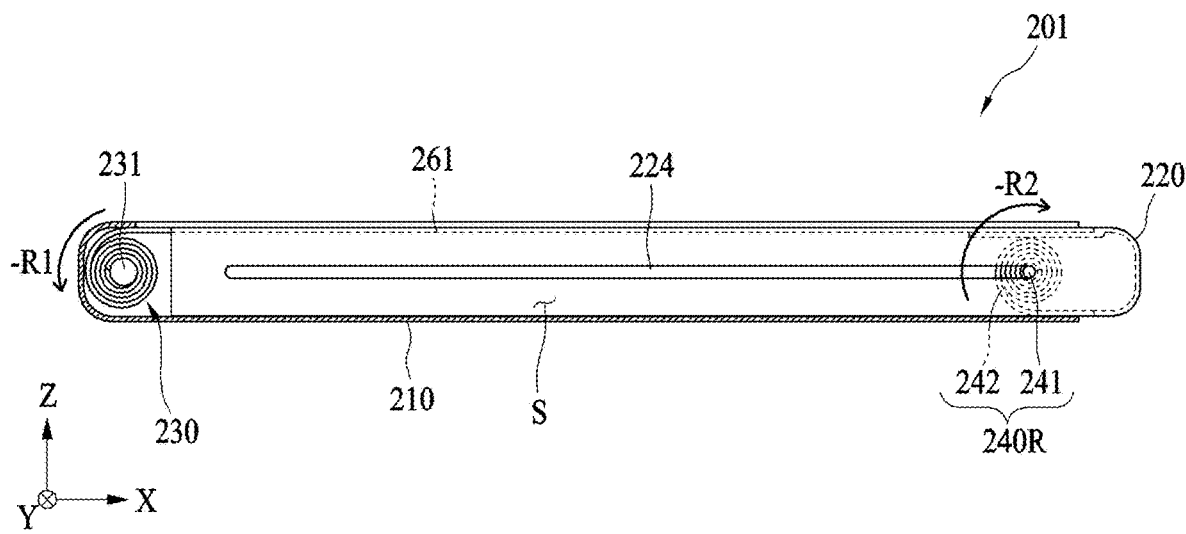

FIGS. 2E through 2G are diagrams illustrating an example operation of an electronic device according to an example embodiment.

Referring to FIG. 2E, illustrated is the electronic device 201 with the display 261 reduced (e.g., the electronic device 201 of FIG. 2A). According to an example embodiment, the electronic device 201 may operate as follows. The first roller 230 may roll the display 261 around the first shaft 231 in a first rotational direction R1, and the second roller 240R may roll the plate 242 around the second shaft 241 in a second rotational direction R2 opposite to the first rotational direction R1. The display 261 may start extend in a first direction (e.g., an X direction) while being unwound from the first shaft 231 in the first rotational direction R1, and the plate 242 may start to extend in the first direction while being unwound from the second shaft 241 in the second rotational direction R2. As the plate 242 connected to a distal portion (e.g., the distal portion 226 of FIG. 2D) of a slider (e.g., the slider 222 of FIG. 2D) of the second housing 220 pushes the second housing 220, the second housing 220 may start to recede from the first housing 210 in the first direction. The second shaft 241 may start to move in a second direction (e.g., a −X direction) along the slot 224.

Referring to FIG. 2F, illustrated is the electronic device 201 with the display 261 extended (e.g., the electronic device 201 of FIG. 2B). The display 261 and the plate 242 may be extended by the rolling of the first roller 230 and the rolling of the second roller 240R until the second shaft 241 reaches an end of the slot 224. The plate 242 may form substantially an overall lower cover of the electronic device 201 along with a lower cover (e.g., the lower cover 214 of FIG. 2D) of the first housing 210 while extending in the first direction (e.g., the X direction) by the second roller 240R. While the display 261 and the plate 242 are extending, the mounting space S defined by the first housing 210, the second housing 220, and the display 261 may still be secured.

Figure 3:
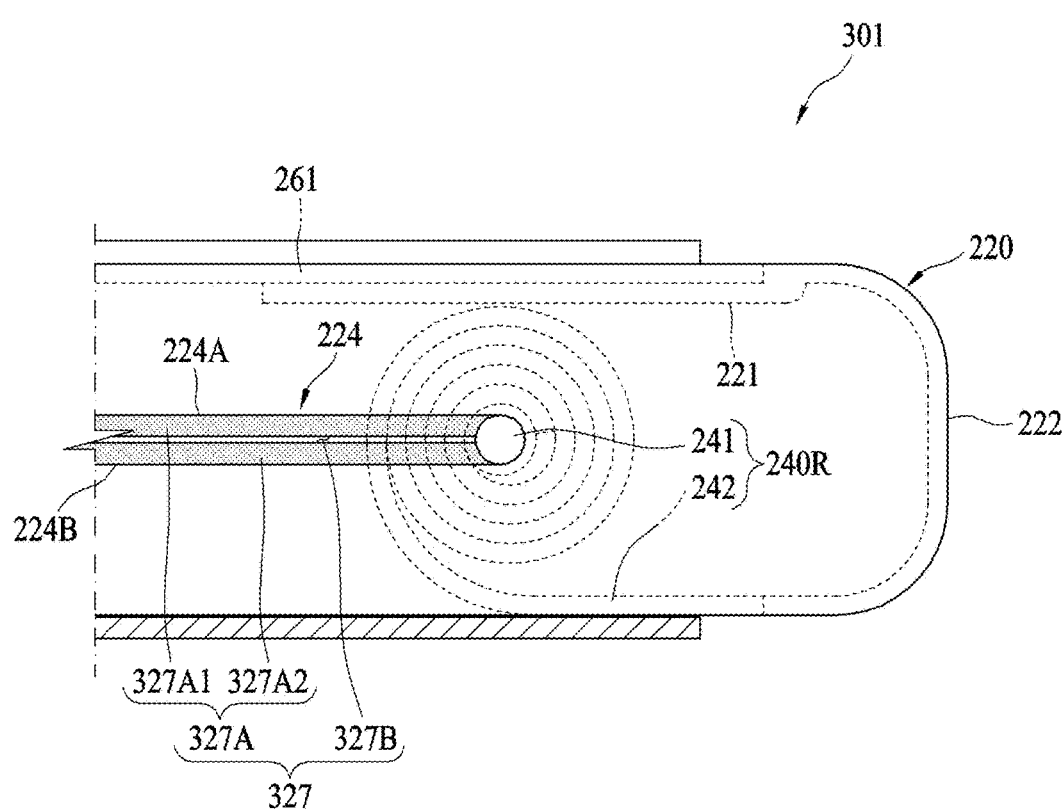
FIG. 3 is a partial cross-sectional view of an example electronic device according to an additional example embodiment.

Referring to FIG. 2G, illustrated is the electronic device 201 in a state in which the display 261 that is extended is reducing. According to an example embodiment, the electronic device 201 may operate as follows. The first roller 230 may roll the display 261 around the first shaft 231 in a third rotational direction (−R1) opposite to a first rotational direction (e.g., the first rotational direction R1 of FIG. 2E), and the second roller 240R may roll the plate 242 around the second shaft 241 in a fourth rotational direction (−R2) opposite to a second rotational direction (e.g., the second rotational direction R2 of FIG. 2E) and the third rotational direction (−R1). The display 261 may be reduced in a second direction (e.g., the −X direction) while being wound around the first shaft 231 in the third rotational direction (−R1), and the plate 242 may be reduced in the second direction while being wound around the second shaft 241. As the plate 242 connected to a distal portion (e.g., the distal portion 226 of FIG. 2D) of a slider (e.g., the slider 222 of FIG. 2D) of the second housing 220 pulls the second housing 220, the slider of the second housing 220 may approach a first side cover (e.g., the first side cover 215 of FIG. 2D) of the first housing 210 in the second direction. The second shaft 241 may move in a first direction (e.g., the X direction) along the slot 224. While the display 261 and the plate 242 are being reduced, the mounting space S defined by the first housing 210, the second housing 220, and the display 261 may still be secured. FIG. 3 is a partial cross-sectional view of an example electronic device according to an additional example embodiment.

Referring to FIG. 3, according to an example embodiment, an electronic device 301 may further include a sealing portion 327 configured to seal the slot 224 formed in the third side covers 223 of the second housing 220. The sealing portion 327 may prevent or postpone an entry or inflow of matter from the outside of the electronic device 301 into a mounting space (e.g., the mounting space S of FIG. 2C). The sealing portion 327 may be formed along the slot 224 to substantially cover the slot 224.

In the embodiment, the sealing portion 327 may include an elastically deformable portion 327A and a slit 327B. The elastically deformable portion 327A may include a first lengthwise portion 327A1 installed at a first edge 224A along the first edge 224A of the slot 224 and a second lengthwise portion 327A2 installed at a second edge 224B along the second edge 224B opposite to the first edge 224A of the slot 224. The elastically deformable portion 327A may be formed of rubber, silicone, and other elastic materials. The slit 327B may be formed between the first lengthwise portion 327A1 and the second lengthwise portion 327A2 along the slot 224. Through such a structure described above, when the second shaft 241 is guided along the slot 224, the first lengthwise portion 327A1 and the second lengthwise portion 327A2 may be elastically deformed at a position at which the second shaft 241 is present in the slot 224, which allows a smooth movement of the second shaft 241. In addition, a shape of the first lengthwise portion 327A1 and the second lengthwise portion 327A2 may be maintained at a position at which the second shaft 241 is not present in the slot 224, and thus an entry or inflow of matter into the mounting space S may be blocked.

Figure 4A:
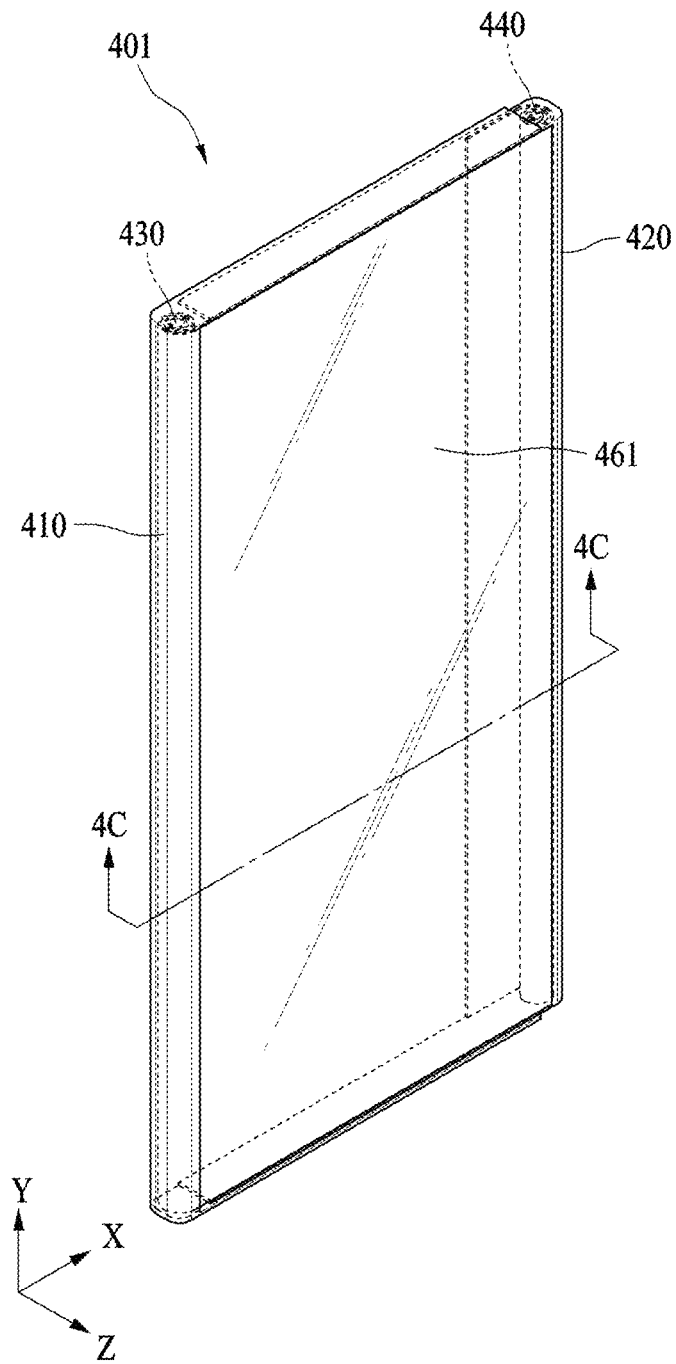
FIG. 4A is a perspective view of an example electronic device with a display reduced according to an example embodiment.
Figure 4B:
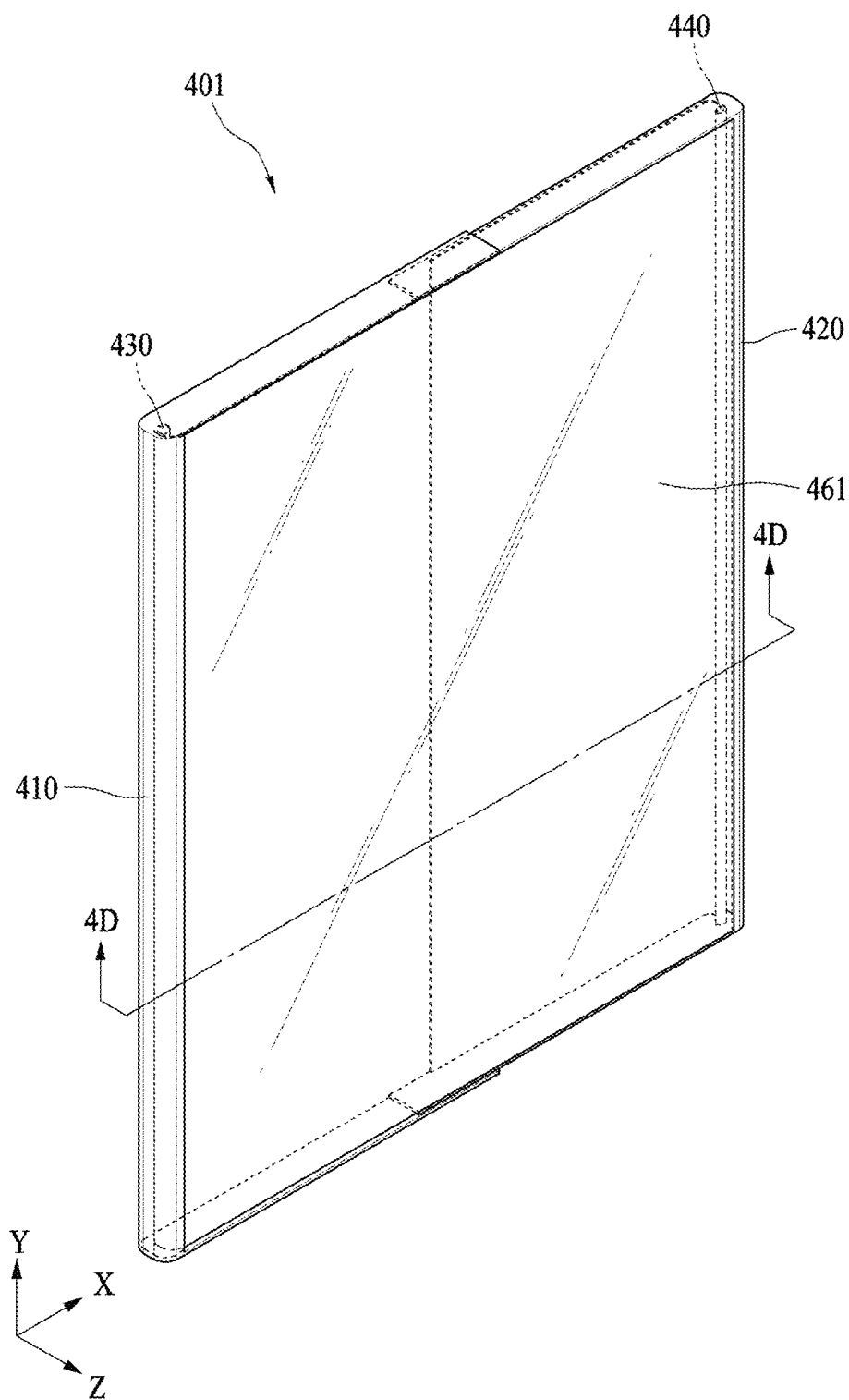
FIG. 4B is a perspective view of an example electronic device with a display extended according to an example embodiment.
Figure 4C:
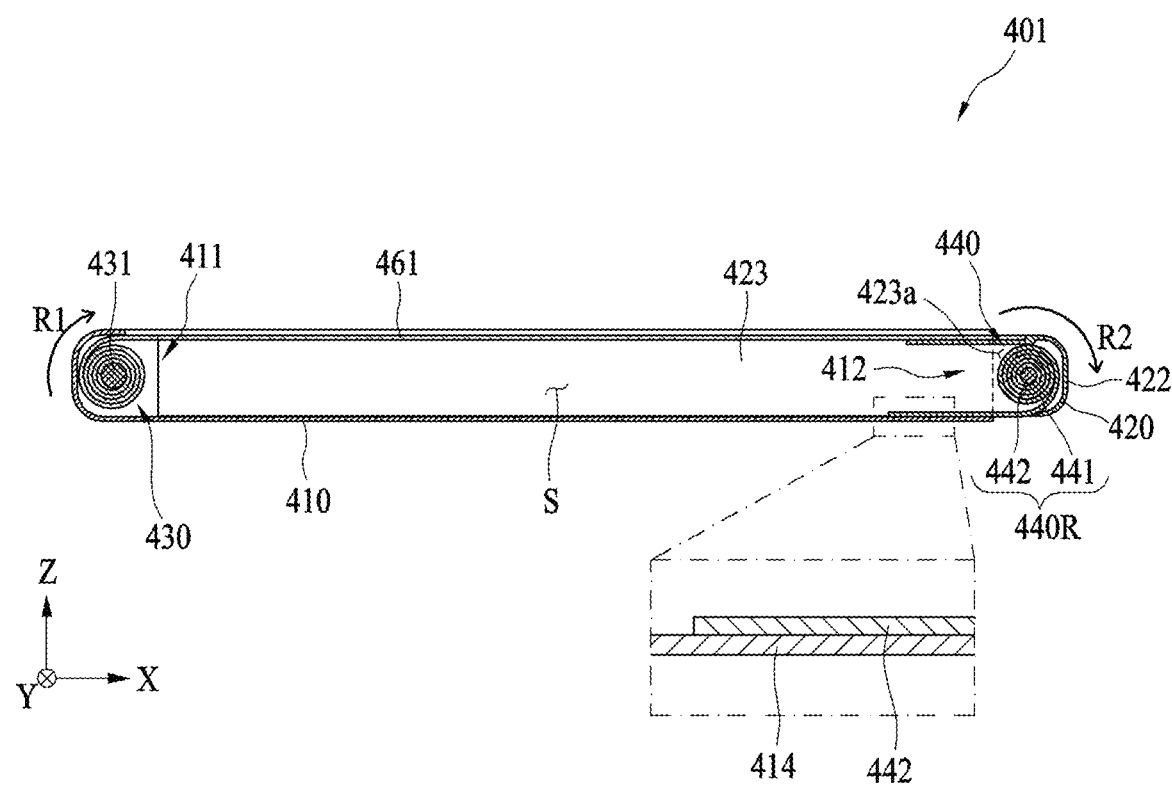
FIG. 4C is a cross-sectional view of the electronic device of FIG. 4A cut by a 4C-4C line.
Figure 4D:
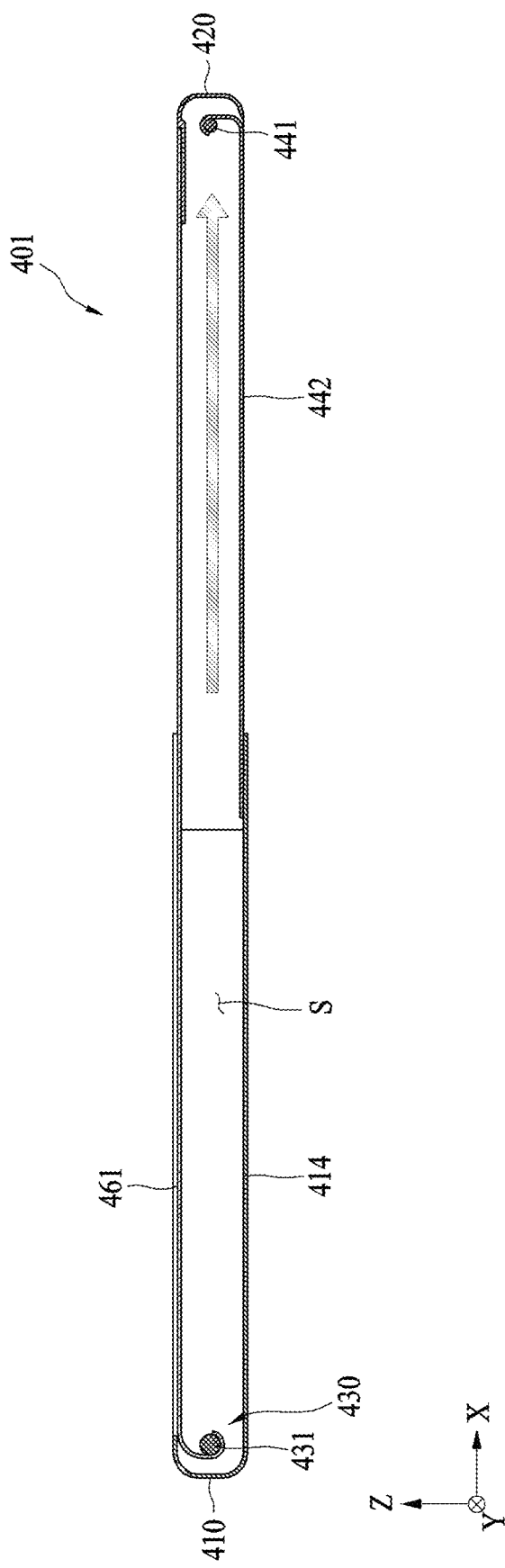
FIG. 4D is a cross-sectional view of the electronic device of FIG. 4B cut by a 4D-4D line.

FIG. 4A is a perspective view of an example electronic device with a display reduced according to an example embodiment, and FIG. 4B is a perspective view of an example electronic device with a display extended according to an example embodiment. FIG. 4C is a cross-sectional view of the electronic device of FIG. 4A cut by a 4C-4C line, and FIG. 4D is a cross-sectional view of the electronic device of FIG. 4B cut by a 4D-4D line.

Referring to FIGS. 4A through 4D, according to an example embodiment, an electronic device 401 may include a first housing 410 (e.g., the first housing 210 of FIG. 2C), a second housing 420 (e.g., the second housing 220 of FIG. 2C), a first roller 430 (e.g., the first roller 230 of FIG. 2C), a moving structure 440 (e.g., the moving structure 240 of FIG. 2C), and display 461 (e.g., the display 261 of FIG. 2C).

The first housing 410 may include a first side 411 (e.g., the first side 211 of FIG. 2D), a second side 412 (e.g., the second side 212 of FIG. 2D), an upper cover (e.g., the upper cover 213 of FIG. 2D), a lower cover 414 (e.g., the lower cover 214 of FIG. 2D), a first side cover (e.g., the first side cover 215 of FIG. 2D), and a second side cover (e.g., the second side covers 216 of FIG. 2D).

The second housing 420 may include a support (e.g., support 221 of FIG. 2D), a slider (e.g., the slider 222 of FIG. 2D), and a third side cover 423 (e.g., the third side covers 223 of FIG. 2D).

The first roller 430 may include a first shaft 431 (e.g., the first shaft 231 of FIG. 2D) rotatably installed in a first axial groove (e.g., the first axial groove 217 of FIG. 2D) formed on the first side 411 of the first housing 410.

The moving structure 440 may move the second housing 420 from the first housing 410 in a first direction (e.g., an X direction in FIG. 4C) to extend the display 461 in the first direction, and move the second housing 420 toward the first housing 410 in a second direction (e.g., a −X direction in FIG. 4C) to reduce the display 461 in the second direction. In a state of the electronic device 401 where the display 461 is reduced, the moving structure 440 may be installed at an end of the second housing 420 adjacent to the second side 412 of the first housing 410 opposite to the first side 411 of the first housing 410 on which the first roller 430 is disposed. The first roller 430 and the moving structure 440 are disposed separately from each other with a mounting space S therebetween, and it is thus possible to secure the performance of a component(s) that may be installed in the mounting space S. In addition, when the moving structure 440 is installed in the second housing 420 instead of the first housing 410, the mountability of the component(s) that may be installed in the mounting space S may be further improved as the first housing 410 and the second housing 420 recede farther from each other.

In the embodiment, the moving structure 440 may include a second roller 440R (e.g., the second roller 240R of FIG. 2D). The second roller 440R may include a second shaft 441 (e.g., the second shaft 241 of FIG. 2D) and a plate 442 (e.g., the plate 242 of FIG. 2D). The second shaft 441 may be installed in an end region 423a (e.g., the end region 223a of FIG. 2D) of the third side cover 423 (e.g., the third side covers 223 of FIG. 2D) adjacent to the slider 422 of the second housing 420. In this case, unlike the embodiment described above with reference to FIGS. 2A to 2D, the second shaft 441 may rotate while being constrained to the second housing 420 without being installed in the first housing 410, and thus the second shaft 441 may not hinder a movement of the second housing 420 with respect to the first housing 410. Accordingly, a slot (e.g., the slot 224 of FIG. 2D) configured to guide the second shaft 441 may not be formed in the third side cover 423 of the second housing 420. The plate 442 may push or pull the first housing 410. One end of the plate 442 may be connected to the second shaft 441, and the other end of the plate 442 may be connected to the first housing 410.

In the embodiment, the plate 442 may come into face-to-face contact with the first housing 410. Referring to FIG. 4C, a surface of an end side of the plate 442 may maintain the contact with a surface of the second side 412 of the lower cover 414 of the first housing 410. According to some example embodiments, the surface of the end side of the plate 442 may remain secured to the surface of the second side 412 of the lower cover 414. According to some example embodiments not shown, the first housing 410 may include a stopper (not shown) configured to secure and limit the end of the plate 442 in place.

Referring to FIG. 4C, illustrated is the electronic device 401 with the display 461 reduced (e.g., the electronic device 401 of FIG. 4A). According to an example embodiment, the electronic device 401 may operate as follows. The first roller 430 may wind the display 461 around the first shaft 431 in a first rotational direction R1, and the second roller 440R may wind the plate 442 around the second shaft 441 in a second rotational direction R2 that is the same direction as the first rotational direction R1. The display 461 may start to extend in a first direction (e.g., an X direction) while being unwound from the first shaft 431 in the first rotational direction R1, and the plate 442 may start to extend in a second direction (e.g., a −X direction) opposite to the first direction while being unwound from the second shaft 441 in the second rotational direction R2. As the plate 442 pushes the lower cover 414 of the first housing 410, the second housing 420 may start to recede farther from the first housing 410 in the first direction.

Referring to FIG. 4D, illustrated is the electronic device 401 with the display 461 extended (e.g., the electronic device 401 of FIG. 4B). The display 461 and the plate 442 may extend by the rolling of the first roller 430 and the rolling of the second roller 440R until the display 461 is substantially completely unwound from the first shaft 431 and until the plate 442 is substantially completely unwound from the second shaft 441. The plate 442 may form substantially an overall lower cover of the electronic device 401 along with the lower cover 414 of the first housing 410 while extending in the second direction (e.g., the −X direction) by the second roller 440R. While the second housing 420 is receding farther from the first housing 410, the spatial efficiency of the mounting space S defined by the first housing 410, the second housing 420, and the display 461 may be improved.

A state of the electronic device 401 of FIG. 4D may change to a state of the electronic device 401 of FIG. 4C. That is, when the second housing 420 moves toward the first housing 410, the display 461 may be reduced in the second direction (e.g., the −X direction). In this case, the first roller 430 may roll the display 461 in a direction opposite to the first rotational direction R1, and the second roller 440R may roll the plate 442 in a direction opposite to the second rotational direction R2. The plate 442 may pull the lower cover 414 of the first housing 410, and thus the second housing 420 may be closer to the first housing 410. While the display 461 and the plate 442 are being reduced, the mounting space S defined by the first housing 410, the second housing 420, and the display 461 may still be secured.

Figure 5A:
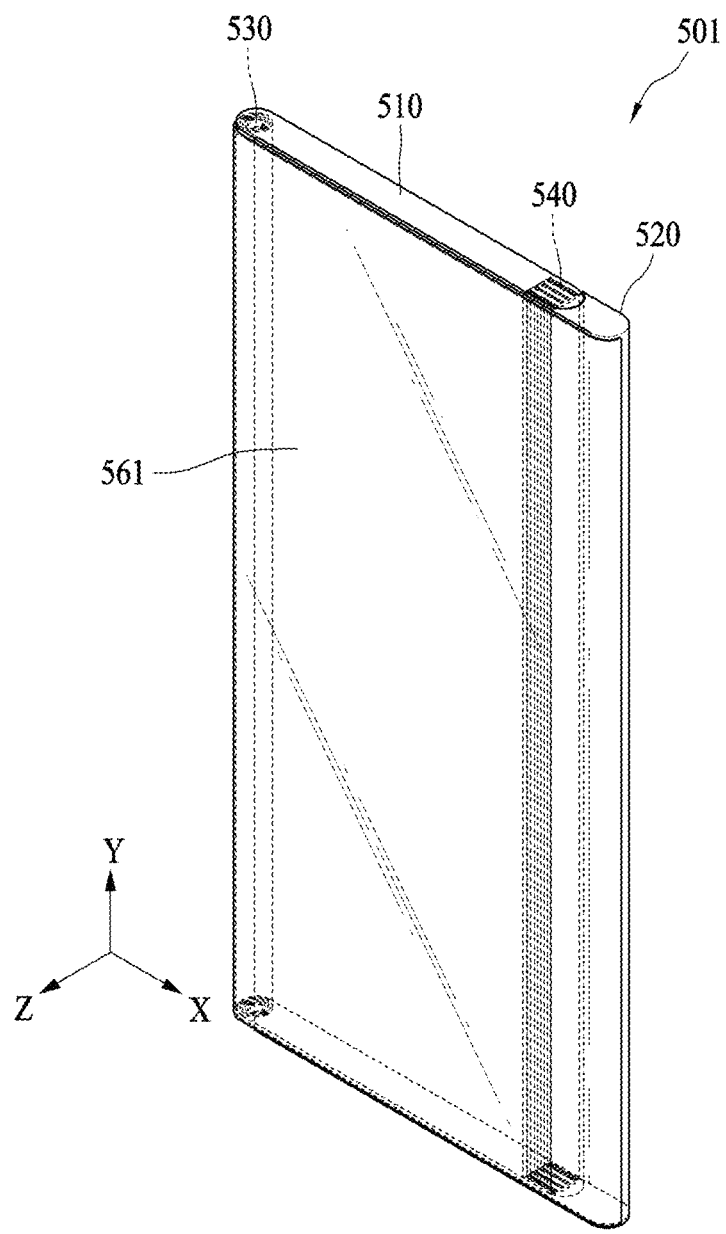
FIG. 5A is a perspective view of an example electronic device according to an example embodiment.
Figure 5B:
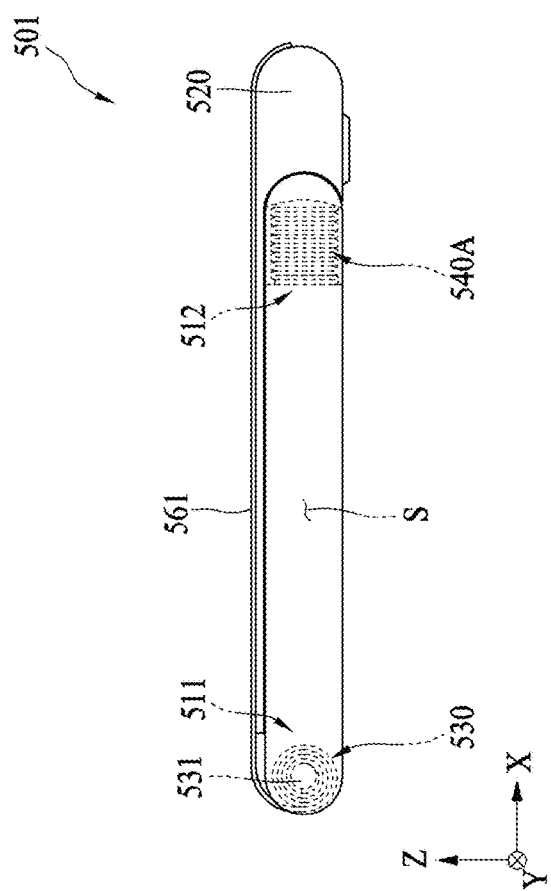
FIGS. 5B and 5C are diagrams illustrating an example operation of an electronic device according to an example embodiment.
Figure 5C:
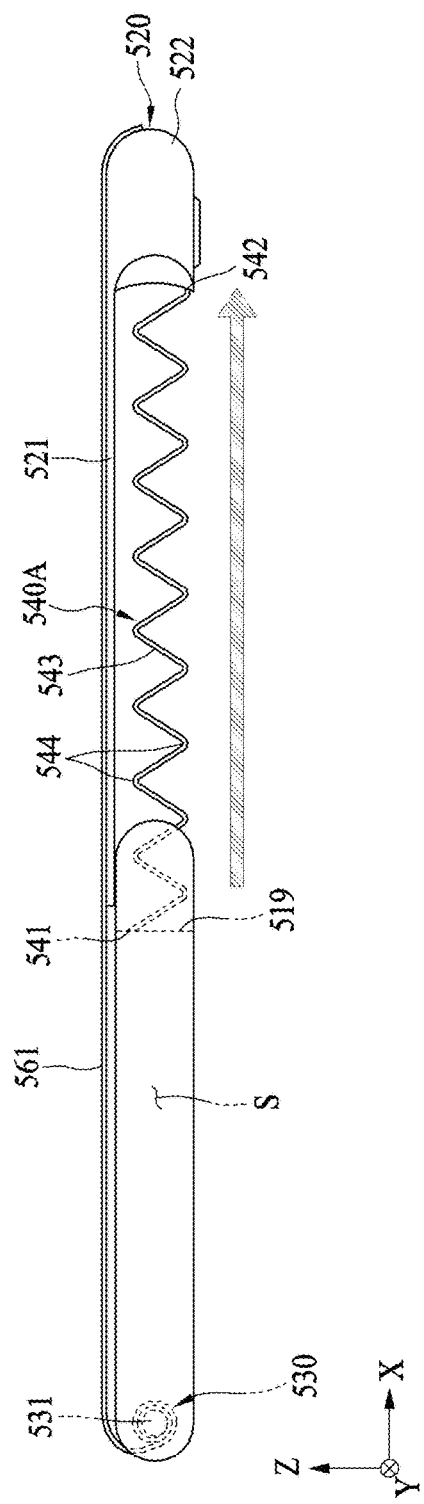

FIG. 5A is a perspective view of an example electronic device according to an example embodiment, and FIGS. 5B and 5C are diagrams illustrating an example operation of an electronic device according to an example embodiment.

Referring to FIGS. 5A through 5C, according to an example embodiment, an electronic device 501 may include a first housing 510 (e.g., the first housing 210 of FIG. 2C), a second housing 520 (e.g., the second housing 220 of FIG. 2C), a first roller 530 (e.g., the first roller 230 of FIG. 2C), a moving structure 540 (e.g., the moving structure 240 of FIG. 2C), and a display 561 (e.g., the display 261 of FIG. 2C).

The first housing 510 may include a first side 511 (e.g., the first side 211 of FIG. 2D), a second side 512 (e.g., the second side 212 of FIG. 2D), an upper cover (e.g., the upper cover 213 of FIG. 2D), a lower cover (e.g., the lower cover 214 of FIG. 2D), a first side cover (e.g., the first side cover 215 of FIG. 2D), and a second side cover (e.g., the second side covers 216 of FIG. 2D). The first housing 510 may include a partition 519. The partition 519 may define a mounting space S along with the display 561 in addition to the upper cover (e.g., the upper cover 213 of FIG. 2D), the lower cover (e.g., the lower cover 214 of FIG. 2D), the first side cover (e.g., the first side cover 215 of FIG. 2D), and the second side cover (e.g., the second side covers 216 of FIG. 2D) of the first housing 510. The partition 519 may extend between the upper cover (e.g., the upper cover 213 of FIG. 2D) and the lower cover (e.g., the lower cover 214 of FIG. 2D) of the first housing 510.

The second housing 520 may include a support 521 (e.g., the support 221 of FIG. 2D) and a slider 522 (e.g., the slider 222 of FIG. 2D).

The first roller 530 may include a first shaft 531 (e.g., the first shaft 231 of FIG. 2D) rotatably installed in a first axial groove (e.g., the first axial groove 217 of FIG. 2D) formed on the first side 511 of the first housing 510.

The moving structure 540 may move the second housing 520 from the first housing 510 in a first direction (e.g., an X direction in FIG. 5B) to extend the display 561 in the first direction, and move the second housing 520 toward the first housing 510 in a second direction (e.g., a −X direction in FIG. 5B) to reduce the display 561 in the second direction. In a state of the electronic device 501 in which the display 561 is reduced, the moving structure 540 may be installed on the second side 512 of the first housing 510 opposite to the first side 511 of the first housing 510 on which the first roller 530 is to be disposed. The first roller 530 and the moving structure 540 are disposed separately from each other with the mounting space S therebetween, and it is thus possible to secure the performance of a component(s) that may be installed in the mounting space S.

The moving structure 540 may include a folding member 540A. The folding member 540A may change in shape between a contracting shape (e.g., a shape of the folding member 540A illustrated in FIG. 5B) that allows the second housing 520 to approach closer the first housing 510 and an extending shape (e.g., a shape of the folding member 540A illustrated in FIG. 5C) that allows the second housing 520 to recede farther from the first housing 510.

In the embodiment, the folding member 540A may have a first end 541 and a second end 542, and include an extension 543 that extends between the first end 541 and the second end 542. The first end 541 of the folding member 540A may be connected to the partition 519 of the first housing 510, and the second end 542 of the folding member 540A may be connected to the slider 522 of the second housing 520. The extension 543 may adjust a distance between the first housing 510 and the second housing 520 while elastically behaving in a longitudinal direction (e.g., an X direction) between the first end 541 and the second end 542. According to some example embodiments, the first end 541 of the folding member 540A may be secured to the partition 519 of the first housing 510, and the second end 542 of the folding member 540A may be secured to the slider 522 of the second housing 520.

In the embodiment, the extension 543 may include a plurality of folds 544. The folds 544 may ensure a consistent shape change of the extension 543 while the extension 543 is behaving elastically between the first end 541 and the second end 542.

Referring to FIGS. 5B and 5C, according to an embodiment, the electronic device 501 may operate as follows. When the extension 543 of the folding member 540A starts changing in shape from the contracting shape (e.g., the shape of the electronic device 501 illustrated in FIG. 5B) to the extending shape (e.g., the shape of the electronic device 501 illustrated in FIG. 5C), the slider 522 of the second housing 520 may recede from the first housing 510 as the second end 542 of the folding member 540A moves away from the first end 541. The display 561 disposed on the support 521 and the slider 522 may extend in an extending direction (e.g., the X direction) of the extension 543. The mounting space S defined by the first housing 510 and the display 561 may still be secured. In addition, when the extension 543 of the folding member 540A starts changing the shape from the extending shape (the shape of the electronic device 501 illustrated in FIG. 5C) to the contracting shape (the shape of the electronic device 501 illustrated in FIG. 5B), the slider 522 of the second housing 520 may be closer to the first housing 510 as the second end 542 of the folding member 540A approaches the first end 541. The display 561 disposed on the support 521 and the slider 522 may be reduced in a contracting direction (e.g., the −X direction) of the extension 543. Even in such a case, the mounting space S defined by the first housing 510 and the display 561 may still be secured.

Figure 6:
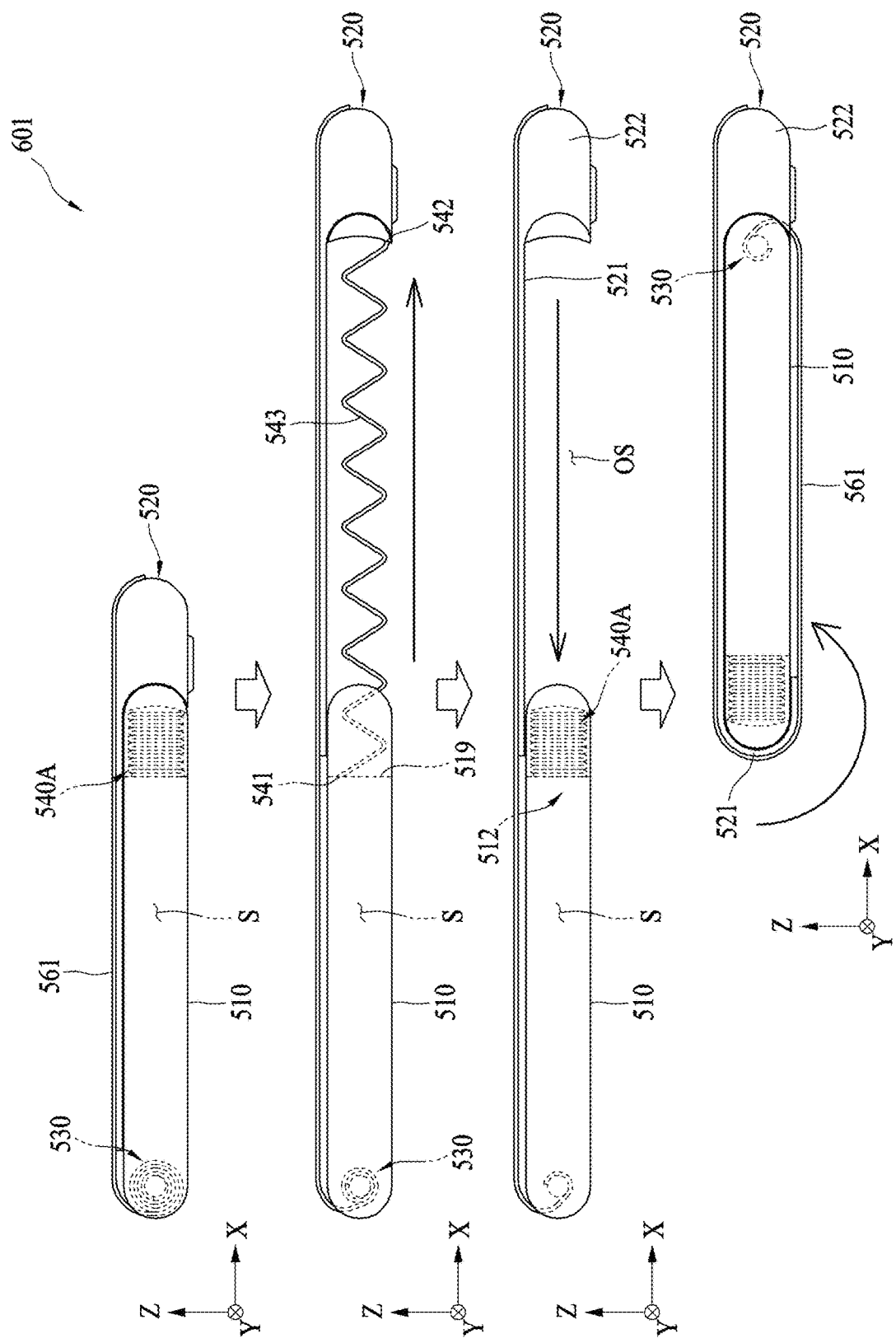
FIG. 6 is a diagram illustrating an example operation of an electronic device according to an additional example embodiment.

FIG. 6 is a diagram illustrating an example operation of an electronic device according to an additional example embodiment.

Referring to FIG. 6, according to an example embodiment, an electronic device 601 (e.g., the electronic device 501 of FIGS. 5A through 5C) may operate as follows. After the second housing 520 moves from the first housing 510 in a first direction (e.g., an X direction) as the extension 543 of the folding member 540A changes in shape from a contracting shape to an extending shape, the second end 542 of the folding member 540A may be separated from the slider 522 of the housing 520. As the second end 542 of the folding member 540A separated from the slider 522 moves toward the first end 541 of the folding member 540A, the folding member 540A may change in shape from the extending shape to the contracting shape. Here, an open space (OS) that is open to the outside of the electronic device 601 may be formed between the folding member 540A installed on the second side 512 of the first housing 510 and the slider 522 of the second housing 520. Subsequently, as the first housing 510 rotates into the open space OS around the folding member 540A installed on the second side 512, a portion of the display 561 may be folded and a portion of the support 521 of the second housing 520 may be bent.

Figure 7:
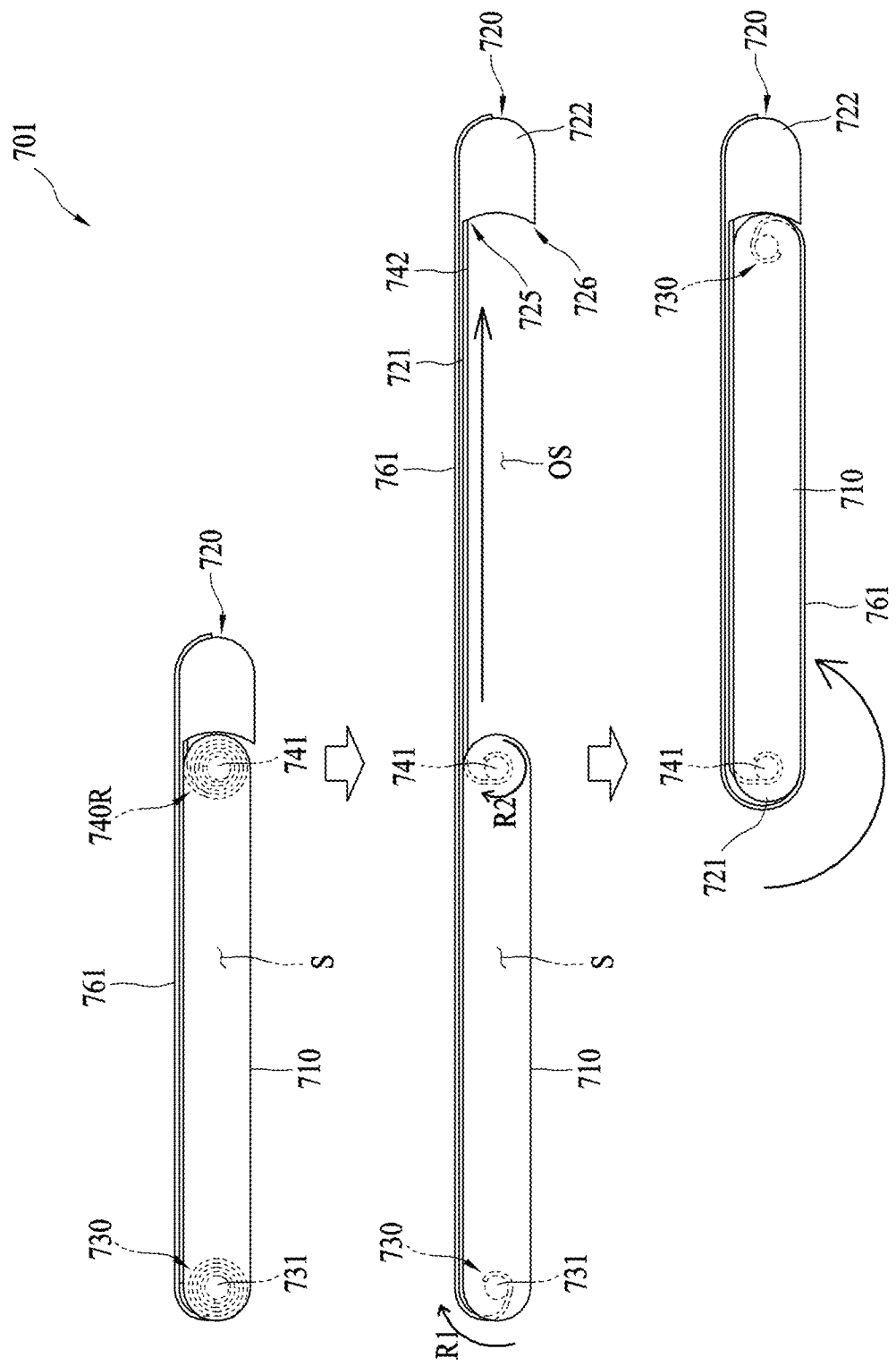
FIG. 7 is a diagram illustrating an example operation of an electronic device according to an example embodiment.

FIG. 7 is a diagram illustrating an example operation of an electronic device according to an example embodiment.

Referring to FIG. 7, according to an example embodiment, an electronic device 701 (e.g., the electronic device 201 of FIG. 2C) may include a first housing 710 (e.g., the first housing 210 of FIG. 2C), a second housing 720 (e.g., the second housing 220 of FIG. 2C), a first roller 730 (e.g., the first roller 230 of FIG. 2C), a moving structure (e.g., the moving structure 240 of FIG. 2C) including a second roller 740R (e.g., the second roller 240R of FIG. 2C), and a display 761.

According to an example embodiment, the electronic device 701 may operate as follows. The first roller 730 may roll the display 761 around a first shaft 731 (e.g., the first shaft 231 of FIG. 2C) in a first rotational direction R1, and the second roller 740R may roll a plate 742 around a second shaft 741 (e.g., the second shaft 241 of FIG. 2D) in a second rotational direction R2 which is the same direction as the first rotational direction R1. The display 761 may start to extend in a first direction (e.g., an X direction) while being unwound from the first shaft 731 in the first rotational direction R1, and the plate 742 may start to extend in the first direction while being unwound from the second shaft 741 in the second rotational direction R2. As, of a proximal portion 725 (e.g., the proximal portion 225 of FIG. 2D) and a distal portion 726 (e.g., the distal portion 226 of FIG. 2D) of a slider 722 (e.g., the slider 222 of FIG. 2D), the plate 742 pushes the proximal portion 725, an open space OS may be formed between the first housing 710 and the second housing 720. Subsequently, as the first housing 710 rotates around the second shaft 741 into the open space OS, a portion of the display 761 may be folded and a portion of the support 721 of the second housing 720 may be bent.

According to an example embodiment, the second housing 720 may not include the support 721. In this case, the plate 742 may come into contact with a surface of the display 761 while being unwound from the second shaft 741 in the second rotational direction R2, thereby supporting the display 761.

Figure 8:
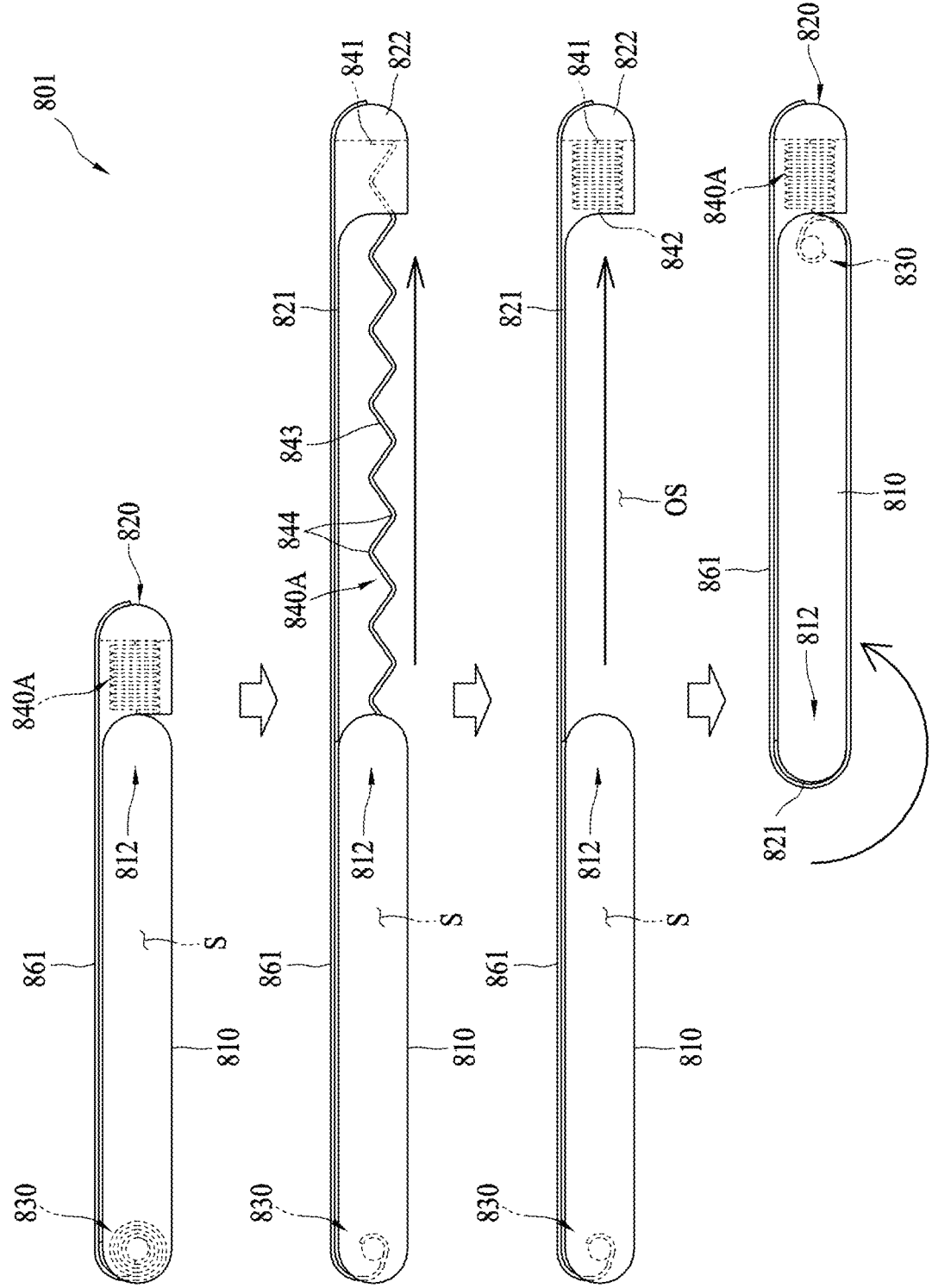
FIG. 8 is a diagram illustrating an example operation of an electronic device according to an example embodiment.

FIG. 8 is a diagram illustrating an example operation of an electronic device according to an example embodiment.

Referring to FIG. 8, according to an example embodiment, an electronic device 801 (e.g., the electronic device 501 of FIG. 5A) may include a first housing 810 (e.g., the first housing 510 of FIG. 5B), a second housing 820 (e.g., the second housing 520 of FIG. 5B), a first roller 830 (e.g., the first roller 530 of FIG. 5B), a moving structure (e.g., the moving structure 540 of FIG. 5A) including a folding member 840A (e.g., the folding member 540A of FIG. 5B), and a display 861 (e.g., the display 561 of FIG. 5A). The folding member 840A may have a first end 841 and a second end 842, and include an extension 843 (e.g., the extension 543 of FIG. 5C) that extends between the first end 841 and the second end 842. The extension 843 may include a plurality of folds 844 (e.g., the folds 544 of FIG. 5C).

In the embodiment, the folding member 840A may be installed in the second housing 820. The first end 841 of the folding member 840A may be secured to a slider 822 (e.g., the slider 522 of FIG. 5C) of the second housing 820, and the second end 842 of the folding member 840A may be connected to a second side cover (e.g., the second side covers 216 of FIG. 2D) on a second side 812 of the first housing 810. Since the folding member 840A is installed in the second housing 820 instead of the first housing 810, the mountability of a component(s) installed in a mounting space S may be further improved.

In the embodiment, the second end 842 of the folding member 840A may be separated from the first housing 810. The second end 842 of the folding member 840A that is separated may move toward the first end 841 of the folding member 840A, and the folding member 840A may change from an extending shape to a contracting shape. An open space OS may thereby be formed between the first housing 810 and the second housing 820. In this case, as the first housing 810 rotates into the open space OS around the second side 812 of the first housing 810, a portion of the display 861 may be folded and a portion of a support 821 (e.g., the support 521 of FIG. 5C) of the second housing 820 may be bent.

According to various example embodiments described herein, an electronic device (e.g., 201, 301, 401, 501, 601, 701, or 801) may include a display (e.g., 261, 361, 561, 661, 761, or 861); a first housing (e.g., 210, 310, 510, 710, or 810) including an upper cover (e.g., 213), a lower cover (e.g., 214), a first side cover (e.g., 215) configured to connect the upper cover and the lower cover, and a pair of second side covers (e.g., 216) configured to connect the upper cover, the lower cover, and the first side cover; a first roller (e.g., 230, 330, 530, 730, or 830) disposed adjacent to the first side cover and configured to wind the display; a second housing (e.g., 220, 320, 520, 720, or 820) connected to the display; and a moving structure (e.g., 240, 340, 540, 740, and 840) disposed opposite to the first side cover and configured to move the second housing from the first housing.

According to some example embodiments, the moving structure (e.g., 440 or 840) may be installed in the second housing (e.g., 420 or 820).

According to an example embodiment, the moving structure 440 may include the second roller 440R, and the second roller 440R may include the plate 442 configured to push a lower cover of the first housing 410, and the shaft 441 installed in the second housing 420 and around which the plate 442 is wound.

According to an example embodiment, a winding direction R1 of the display 461 may be the same direction as a winding direction R2 of the plate 442.

According to an example embodiment, the plate 442 may be configured to come into face-to-face contact with the lower cover of the first housing 410.

According to some example embodiments, the moving structure (e.g., 240, 540, or 740) may be installed in the first housing to be spaced apart from the first side cover.

According to an example embodiment, the moving structure (e.g., 240) may include a second roller (e.g., 240R or 740R), and the second roller may include a plate (e.g., 242 or 742) configured to push the second housing and a shaft (e.g., 241 or 741) installed in the first housing and around which the plate is wound.

According to an example embodiment, a winding direction R1 of the display 261 may be an opposite direction to a winding direction R2 of the plate 242.

According to an example embodiment, the second housing (e.g., 220) may include a proximal portion (e.g., 225) adjacent to the display (e.g., 261) and a distal portion (e.g., 226) remote from the display (e.g., 261), and the plate (e.g., 242) may push the distal portion of the second housing.

According to an example embodiment, the second housing may include a slot (e.g., 224) configured to guide a shaft.

According to an example embodiment, the second housing may further include a sealing portion (e.g., 327) configured to prevent or postpone an entry or inflow of matter through the slot, and the sealing portion may include a slit (e.g., 327B) formed along the slot (e.g., 224).

According to an example embodiment, the moving structure (e.g., 540) may include a folding member (e.g., 540A), and the folding member (e.g., 540A) may include a first end (e.g., 541) secured to the first housing (e.g., 510), a second end (e.g., 542) connected to the second housing (e.g., 520), and an extension (e.g., 543) that extends between the first end and the second end.

According to an example embodiment, the extension may include a plurality of folds (e.g., 544).

According to an example embodiment, as the second end 542 of the folding member 540A is separated from the second housing 520 and moves toward the first end 541 of the folding member 540A, an open space OS may be formed between the first housing 510 and the second housing 520, and the first housing 510 may be folded into the open space OS with respect to the folding member 540A.

According to some example embodiments, the second housing may include a support (e.g., 221, 521, 721, or 821) and a slider (e.g., 222, 522, 722, or 822) connected to the support and configured to slide from the first housing by the moving structure.

According to an example embodiment, a winding direction R1 of the display 761 may be the same as a winding direction R2 of the plate 742.

According to an example embodiment, the second housing 720 may include the proximal portion 725 adjacent to the display 761 and the distal portion 726 remote from the display 761. As the plate 742 pushes the proximal portion 725 of the second housing 720, an open space OS may be formed between the first housing 710 and the second housing 720, and the first housing 710 may be folded into the open space OS with respect to the shaft 741.

According to some example embodiments, the moving structure may include a folding member (e.g., 840A), and the folding member may include a first end (e.g., 841) secured to the second housing (e.g.; 820), a second end (e.g., 842) connected to the first housing (e.g., 810), and an extension (e.g., 843) that extends between the first end and the second end.

According to various example embodiments described herein, an electronic device may include a display (e.g., 461); a first housing (e.g., 410) including an upper cover, a lower cover, a first side cover configured to connect the upper cover and the lower cover, and a pair of second side covers configured to connect the upper cover, the lower cover, and the first side cover; a first roller (e.g., 430) disposed adjacent to the first side cover and configured to wind the display; a second housing (e.g., 420) connected to the display; and a second roller (e.g., 440R) installed in the second housing opposite to the first side cover and configured to move the second housing from the first housing. The second roller (e.g., 440R) may include a plate (e.g., 442) configured to push the first housing, and a shaft (e.g., 441) installed in the second housing and around which the plate is wound.

According to various example embodiments described herein, an electronic device may include a display (e.g., 261); a first housing (e.g., 210) including an upper cover, a lower cover, a first side cover configured to connect the upper cover and the lower cover, and a pair of second side covers configured to connect the upper cover, the lower cover, and the first side cover; a first roller (e.g., 230) disposed adjacent to the first side cover and configured to wind the display; a second housing (e.g., 220) connected to the display; and a second roller (e.g., 240R) disposed in the first housing separately from the first side cover and configured to move the second housing from the first housing. The second roller (e.g., 240R) may include a plate (e.g., 242) configured to push the second housing, and a shaft (e.g., 241) installed in the first housing and around which the plate is wound.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device, comprising:
   a display;
   a first housing comprising:
   an upper cover,
   a lower cover,
   a first side cover configured to connect the upper cover and the lower cover, and
   a pair of second side covers configured to connect the upper cover, the lower cover, and the first side cover;
   a first roller disposed adjacent to the first side cover and configured to wind the display;
   a second housing connected to the display; and
   a moving structure disposed in the second housing opposite of the display to the first side cover and configured to move the second housing in relation to the first housing, the moving structure comprises a second roller including:
   a plate configured to:
   push the lower cover of the first housing, and
   come into face-to-face contact with the lower cover of the first housing; and
   a shaft disposed in the second housing around which the plate is wound.

2. The electronic device of claim 1, wherein a winding direction of the display is a same direction as a winding direction of the plate.

3. The electronic device of claim 1, wherein the second housing comprises:
- a support configured to support the display; and
- a slider connected to the support and configured to slide from the first housing by the moving structure.

4. The electronic device of claim 1, wherein:
the moving structure comprises a folding member, and
the folding member comprises:
- a first end secured to the second housing;
- a second end releasably connected to the first housing; and
- an extension configured to extend between the first end and the second end.

5. An electronic device, comprising:
a display;
a first housing comprising:
- an upper cover,
- a lower cover,
- a first side cover configured to connect the upper cover and the lower cover, and
- a pair of second side covers configured to connect the upper cover, the lower cover, and the first side cover;

a first roller disposed adjacent to the first side cover and configured to wind the display;
a second housing connected to the display;
a second roller disposed in the second housing opposite of the display to the first side cover and configured to move the second housing in relation to the first housing,
wherein the second roller comprises:
- a plate configured to:
  - push the lower cover of the first housing, and
  - come into face-to-face contact with the lower cover of the first housing; and
- a shaft installed in the second housing around which the plate is wound.

6. An electronic device, comprising:
a display;
a first housing comprising:
- an upper cover,
- a lower cover,
- a first side cover configured to connect the upper cover and the lower cover, and
- a pair of second side covers configured to connect the upper cover, the lower cover, and the first side cover;

a first roller disposed adjacent to the first side cover and configured to wind the display;
a second housing connected to the display; and
a second roller disposed in the first housing to be spaced apart from the first side cover and configured to move the second housing in relation to the first housing,
wherein the second roller comprises:
- a plate configured to:
  - push the second housing, and
  - come into face-to-face contact with the second housing; and
- a shaft disposed in the first housing around which the plate is wound.

\* \* \* \* \*